LOGIC CIRCUIT
Filed March 21, 1966
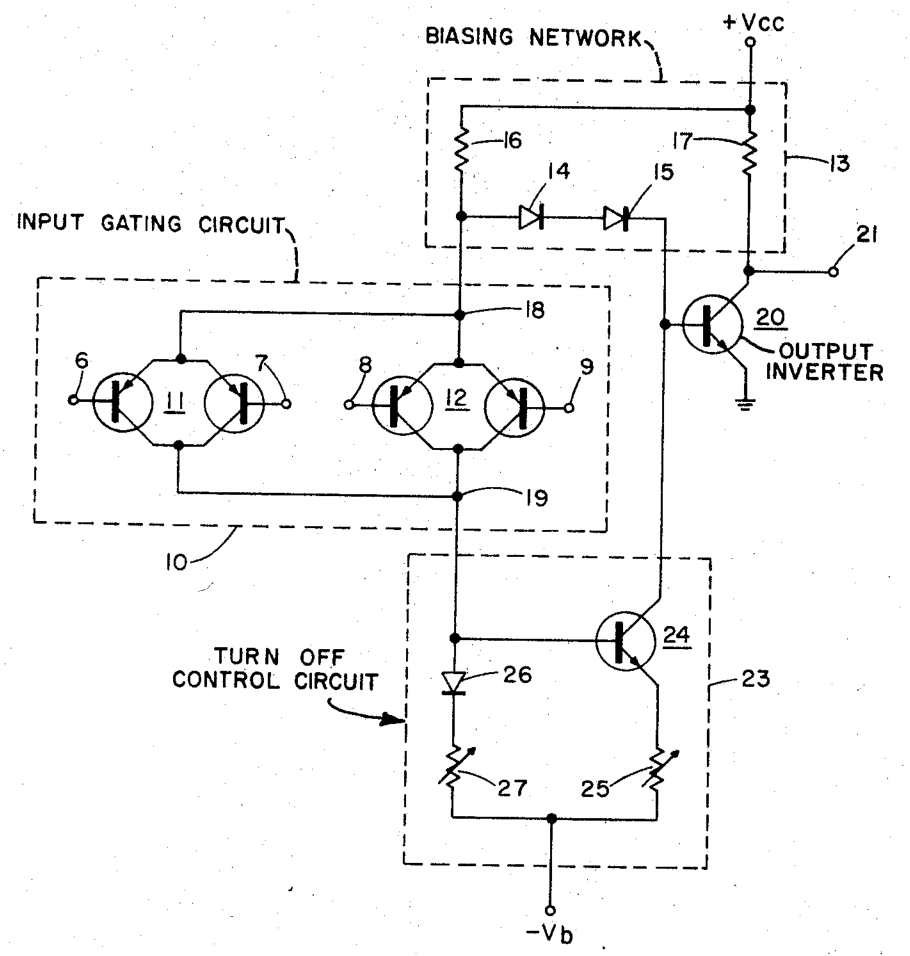
INVENTORS
Walter C. Seelbach
Frederick J. Kirkpatrick
BY
Mueller, Aichele & Rauner
ATTY'S.

United States Patent Office 3,437,831
Patented Apr. 8, 1969

3,437,831
LOGIC CIRCUIT

Walter C. Seelbach, Scottsdale, Ariz., and Frederick J. Kirkpatrick, Austin, Tex., assignors to Motorola, Inc., Franklin Park, Ill., a corporation of Illinois Filed Mar. 21, 1966, Ser. No. 536,029
Int. Cl. H03k *19/08*
U.S. Cl. 307—215 11 Claims The present invention relates generally to logic gates and more particularly to an integrated semiconductor logic gate with improved switching characteristics and an improved fan-out capability.

Diode-transistor logic (DTL) circuits are well known in the field of integrated semiconductor logic systems. One well known DTL circuit includes, in addition to input gating diodes, offset diodes and power supply connections, an output inverter transistor to which is connected a resistor to drain turn-off current from the inverter when the logic signals at the input gating diodes reach a predetermined level. This resistor is often referred to as the "pull down" resistor, and it is usually connected between a control electrode of the inverter and either ground or a source of biasing potential. One disadvantage of this circuit arrangement is that the pull down resistor is always connected to the inverter and it drains some current during the conduction of the inverter and during the time in which the conductor is turned on, thereby limiting the fan-out capabilities of the logic stage of which the inverter is a part.

It is an object of the present invention to provide an integrated semiconductor logic gate with improved switching characteristics and an improved fan-out capability.

It is another object of the invention to provide an improved logic gate of the type described having an improved turn-on drive characteristic.

A feature of the present invention is the provision of a logic gate including an output inverter, a biasing circuit connected to the inverter and a plurality of parallel connected gating circuits connectable to a source of input binary logic gating signals and connected to the biasing circuit for turning off the output inverter when input logic signals having a predetermined logic level and pattern are present at the gating circuits.

Another feature of the invention is the provision of an inverter turn-off control circuit including impedance means connected to the plurality of gating circuits and to the output inverter for coupling the impedance means to the inverter only when the inverter is driven nonconducting and during its period of nonconduction thereby insuring that the impedance means is disconnected from the inverter during the period in which the output inverter is conducting.

Another features of the invention is the provision of a plurality of emitter coupled transistor pairs forming the gating circuits and connected between the biasing circuit and the inverter turn-off control circuit. These emitter coupled transistor pairs form a NAND logic switching arrangement in that each transistor must see a logical "ONE" for the output inverter to conduct and produce a logical "ZERO."

Another feature of the invention is the provision of variable impedance means included in the inverter turn-off control circuit for varying the amount of current flowing in the control circuit and thereby changing the level of input binary logic switching signals required to change the conductive state of the output inverter.

Referring to the accompanying drawing there is shown a schematic diagram of a single embodiment of the invention.

Briefly described, the invention includes an output inverter having input, output and control electrodes, a biasing circuit connected between the inverter and a voltage supply and a plurality of parallel connected gating circuits, each connectable to a source of logic switching signals and connected to the biasing circuit for changing the conductive state of the inverter upon the application of a predetermined logic signal level and pattern at the parallel connected gating circuits. An inverter turn off control circuit including a variable impedance is connected to the plurality of gating circuits and to the output inverter for coupling the impedance to the inverter only when the inverter is driven nonconducting and during the nonconductive state of the inverter. The inverter turn off control circuit is turned on with the application of a logical "ZERO" to any one of the gating circuits thereby insuring that the variable impedance is coupled to the inverter as it is being driven nonconducting.

Referring in somewhat more detail to the drawing there is shown an input gating circuit 10 including emitter coupled transistor pairs 11 and 12 with each transistor in the pair having a switching terminal 6, 7, 8 or 9 respectively connected to the base electrode thereof. The gating circuit 10 is connected to an output inverter transistor 20 via a biasing network 13. The biasing network 13 includes bias resistor 16 and a pair of offset diodes 14 and 15 connected in series to the base of the inverter NPN transistor 20. A load resistor 17 is connected between a source of positive potential +Vcc and the output electrode of inverter 20, and the NPN inverter 20 and the PNP transistor pairs 11 and 12 are formed on a single chip in a monolithic integrated circuit. Although opposite conductivity type of transistors are used in the logic circuit according to the invention, the descriptors or modifiers "emitter," "base" and "collector" will be used synonymously with "input," "control" and "output" in modifying the transistor electrodes.

The inverter turn off control circuit 23 includes the control NPN transistor 24 having its P type base section integrally formed with the P type collector regions of the transistor pairs 11 and 12 in a monolithic integrated semiconductor structure. The control circuit 23 also includes a temperature compensating diode 26 having the P type anode portion thereof formed integral with the P type base section of the control transistor 24 and the P type collectors of transistor pairs 11 and 12. A pair of resistors 25, 27 are connected as shown between the semiconductor devices 24 and 26 respectively and the negative voltage source $-V_B$.

With the transistor 24 conducting, the inverter turn-off control circuit 23 is a current source and replaces the pull down resistor of the prior art diode-transistor logic circuits described above. With all of the input terminals 6–9 to the base electrodes of the transistor pairs 11 and 12 high or at a first predetermined logic "ONE" level, the voltage at point 18 in the circuit will be greater than three diode drops caused by current flowing through the offset diodes 14 and 15 and the emitter base junction of the inverter 20. In this instance, the output inverter 20 is conducting and the terminal 21 is at a "ZERO" logic level, which is equal to the collector-to-emitter saturation voltage of the inverter 20. Thus, the gate provides a positive NOT–AND or NAND function, requiring that all logic inputs be high in order to produce a low or "ZERO" output.

If any one input to the base electrodes of the transistor pairs 11 and 12 goes low to a second predetermined logical "ZERO" level, the particular transistor to which the logical ZERO is applied will conduct and the voltage at terminal 19 will rise to a level sufficiently high to bias the current source transistor 24 into conduction. At the same time the voltage at point 18 will drop below the required three diode drops and the output inverter 20 will be turned off. Thus, the turn-off resistor 25 is connected for the inverter 20 base circuit only when turn-off current for the inverter 20 is required. At all other times the control circuit 23 including current source transistor 24 and bias resistor 27 is disconnected from the base circuit of the inverter 20. There is no current drained through a pull down resistor either when the inverter 20 is driven "on" with a NAND logic pattern at the base electrodes of the transistor pairs 11 and 12 or during the normal period of conduction of the inverter 20.

The control circuit 23 also has the advantage of being able to vary the amount of turn on drive at the transistor pairs 11 and 12. This may be accomplished either by varying the value of the common emitter resistor 25 to vary the turn-off current in the base circuit of the inverter 20 or by varying the emitter base bias resistor 27 in the control circuit 23. Therefore, when compared to the turn-on drive current required by the plurality of parallel connected input gating diodes of the prior art diode-transistor logic gate, the turn-on drive current for the transistor pairs 11 and 12 can be relatively small.

Thus, the invention described above possesses a high fan out capability due to the removal of current drain from the base of inverter 20 when the inverter 20 is driven on. Since it is normal to require that one stage drive a number of output stages at the output terminal 21, this increase in fan out capability for a single logic stage will greatly enhance the total fan out capability of a plurality of cascaded logic stages of the type shown in the drawing.

We claim:

1. A logic gate including in combination:
(a) an output inverter having input, output and control electrodes,
(b) biasing circuit means connected to said inverter,
(c) a plurality of parallel connected gating means, each connectable to a source of binary logic switching signals and connected to said biasing circuit for changing the conductive state of said inverter, and,
(d) inverter turn-off control circuit means including impedance means connected to said plurality of parallel connected gating means and conductively connected to said inverter only when said inverter is driven non-conducting and during its non-conducting state whereby said impedance means is conductively disconnected during the time in which said inverter is driven into conduction and during the conductive state thereof.

2. The logic gate according to claim 1 wherein:
(a) said control circuit means includes a control semiconductor device connected between said inverter and said impedance means, and
(b) said gating means being connected between said biasing circuit means and said control semiconductor device for simultaneously turning on said control semiconductor device and turning off said inverter thereby providing a conductive path for inverter turn-off current through said impedance means.

3. The logic gate according to claim 1 wherein:
(a) said biasing circuit means includes resistance means connected to a first voltage supply, and
(b) offset diode means connected between said resistance means and said control electrode of said inverter thereby providing a voltage drop between said resistance means and said inverter when said inverter is conducting, the voltage at said resistance means being sufficient to overcome the voltage drop across said offset diode means and said inverter to drive said inverter into conduction during the presence of binary logic switching signals at said gating means in a first predetermined logic pattern and at a first predetermined logic level.

4. The logic gate according to claim 1 wherein said gating means includes a plurality of emitter-coupled transistors connected in parallel between said biasing circuit means and said inverter turn-off control circuit means, each of the emitter-coupled transistors adapted to be switched into conduction upon the application of binary logic switching signals thereto of a second predetermined level thereby lowering the voltage at said resistance means to a value insufficient to maintain said inverter conducting.

5. The logic gate according to claim 4 wherein:
(a) said control circuit means includes a control semiconductor device connected between said inverter and said impedance means, and
(b) said gating means connected between said biasing circuit means and said control semiconductor device for simultaneously turning on said control semiconductor device and turning off said inverter upon receipt of binary logic switching signals at said second predetermined level.

6. The logic gate according to claim 5 wherein:
(a) said control semiconductor device includes input, output and control electrodes,
(b) said impedance means includes resistance means connected between said input electrode of said control semiconductor device and a second voltage supply,
(c) said control circuit means further including a temperature compensating diode means connected to said control electrode of said control semiconductor device,
(d) a bias resistor connected between said temperature compensating diode means and said second voltage supply, and
(e) said gating means connected to the control electrode of said control semiconductor device for driving said control semiconductor device into conduction as said inverter is turned off.

7. The logic gate according to claim 5 wherein:
(a) said biasing circuit means includes a bias resistor connected to said first voltage supply and offset diode means connected between said bias resistor and said control electrode of said inverter thereby providing a voltage drop between said resistor and said inverter when said inverter is conducting, and
(b) said gating means connected between said bias resistor and said control semiconductor device and providing an open circuit therebetween when all of said emitter-coupled transistors in said gating means are non-conducting thereby providing a voltage at said bias resistor sufficient to render said inverter conducting.

8. The logic gate according to claim 7 wherein:
(a) each of said plurality of emitter-coupled transistors is a PNP transistor having emitter, base and collector electrodes, the emitters of said PNP transistors being connected to said bias resistor and the collectors of said PNP transistors being connected to said control electrode of said control semiconductor device whereby the application of a binary logic switching signal of said second predetermined level at the base electrode of any one of said plurality of PNP transistors causes an increase in voltage at said control electrode of said control semiconductor device sufficient to drive said control semiconductor device into conduction and causes a decrease in voltage at said control electrode of said inverter for turning off said inverter.

9. The logic gate according to claim 8 wherein:
(a) said inverter and said control semiconductor device are NPN transistors having emitter, base and collector electrodes, the P type base electrode of said control transistor being integrally formed with the P type collectors of said PNP transistors in said plurality of emitter-coupled transistors, and (b) temperature compensating diode means having P and N type conductivity sections, said P type conductivity section being integrally formed with said P type base electrode of said control transistor and said P type collector electrodes of said PNP transistors in said plurality of emitter-coupled transistors.

10. A monolithic integrated semiconductor logic gate including in combination:

(a) an output NPN transistor inverter having emitter, base and collector electrodes, (b) bias resistance means connected to a first voltage supply, (c) offset diode means connected between said bias resistance means and the base electrode of said output inverter, (d) a plurality of parallel connected PNP emitter-coupled transistors, each of said PNP transistors having emitter, base and collector electrodes with the base electrodes thereof connectable to a source of binary logic switching signals, and (e) a current source including a NPN current source transistor having emitter, base and collector electrodes and a resistor connected between the emitter electrode of said current source transistor and a second voltage supply, said base electrode of said current source transistor being integrally formed with the collector electrodes of said plurality of PNP emitter-coupled transistors, said current source transistor being turned off during the application of input signals of a first predetermined logic level at said base electrodes of said PNP emitter-coupled transistors and being driven into conduction when the logic level at any base electrode of said emitter-coupled transistors drops to a second predetermined logic level, thereby conductively connecting said resistor in said current source to the base circuit of said output inverter transistor when said inverter is being turned off.

11. The logic gate according to claim 10 which further includes:

(a) a temperature compensating semiconductor diode having the P type anode thereof integrally formed with the P type base electrode of said current source transistor and also integrally formed with the P type collector electrodes of said emitter-coupled transistors, (b) said resistor connected between the emitter of said current source transistor and said second voltage supply being variable in order that current flowing in said current source transistor and the amplitude of said first and second predetermined logic levels may be varied, and (c) an output load resistor connected between the collector of said inverter transistor and said first voltage supply.

References Cited

UNITED STATES PATENTS

| | | | |
|---|---|---|---|
| 3,259,761 | 7/1966 | Narud et al. | 307—215 |
| 3,292,012 | 12/1966 | Cook | 307—213 |
| 3,394,268 | 7/1968 | Murphy | 307—215 |

ARTHUR GAUSS, *Primary Examiner.*

D. D. FORRER, *Assistant Examiner.*

U.S. Cl. X.R.

307—214